(12) United States Patent
Chun et al.

(10) Patent No.: US 7,940,585 B2
(45) Date of Patent: May 10, 2011

(54) MULTI-COLUMN DECODER STRESS TEST CIRCUIT

(75) Inventors: Shin-Ho Chun, Ichon (KR); Sun-Mo An, Ichon (KR)

(73) Assignee: Hynix Semiconductor Inc. (KR)

( * ) Notice: Subject to any disclaimer, the term of this patent is extended or adjusted under 35 U.S.C. 154(b) by 233 days.

(21) Appl. No.: 12/168,611

(22) Filed: Jul. 7, 2008

(65) Prior Publication Data
US 2009/0046524 A1 Feb. 19, 2009

(30) Foreign Application Priority Data
Aug. 14, 2007 (KR) .................. 10-2007-0081558

(51) Int. Cl.
*G11C 29/00* (2006.01)

(52) U.S. Cl. .................. 365/201; 365/200; 365/203

(58) Field of Classification Search .................. 365/201, 365/200, 203, 230.06, 185.17, 230.08, 185.05, 365/185.18, 104, 194
See application file for complete search history.

(56) References Cited

U.S. PATENT DOCUMENTS

| 5,652,725 | A |  | 7/1997 | Suma et al. |  |
| 6,643,805 | B1 | * | 11/2003 | Kikutake et al. | 714/718 |
| 2004/0233703 | A1 | * | 11/2004 | Jeong et al. | 365/154 |
| 2007/0086252 | A1 | * | 4/2007 | Lim et al. | 365/200 |

FOREIGN PATENT DOCUMENTS

| JP | 09-035494 |  | 2/1997 |
| JP | 2006-019016 |  | 1/2006 |
| KR | 10-1999-0056396 |  | 7/1999 |
| KR | 1020030051030 | A | 6/2003 |
| KR | 1020040051197 |  | 6/2004 |
| KR | 1020070036600 | A | 4/2007 |

* cited by examiner

*Primary Examiner* — Dang T Nguyen
(74) *Attorney, Agent, or Firm* — Baker & McKenzie LLP

(57) ABSTRACT

The embodiments described herein are directed to providing a multi-column decoder stress test circuit capable of reducing a column stress test time while sufficiently performing a stress test by using column selection signals. The multi-column decoder stress test circuit comprising a control unit configured to receive at least one column test signal and to generate a multi-column enable signal, and a multi-enable decoding unit configured to receive the multi-column enable signal and to generate a plurality of enabled column selection signals.

18 Claims, 10 Drawing Sheets

000000000000000000000000000000000000000000000000000000000000000000000000000000000
MULTI-COLUMN DECODER STRESS TEST CIRCUIT

CROSS-REFERENCES TO RELATED APPLICATION

The present application claims priority under 35 U.S.C. 119(a) to Korean application number 10-2007-0081558, filed in the Korean Intellectual Property Office on Aug. 14, 2007, which is incorporated by reference in its entirety as if set forth in full.

BACKGROUND

1. Technical Field

The embodiments described herein relate to a semiconductor integrated circuit, and, more particularly, to a multi-column decoder stress test circuit that can reduce the test time for a semiconductor memory.

2. Related Art

Presently, there are limited test capabilities for testing a semiconductor memory once it has been packaged. However, a burn-in stress test for a highly integrated semiconductor memory device is time consuming. This in turn increases both the amount of time required to manufacture the memory and increases the manufacturing. Although a burn-in stress test is generally performed in a package state (hereinafter, referred to as "package burn-in stress test"), research for a wafer burn-in stress test, in which the stress test is performed while the memory is in a wafer state, has been actively conducted to reduce the burn-in stress time. Such a wafer burn-in stress test may be performed within a short period of time, as compared with the package burn-in stress test. This is because a relatively long time is necessary to install a package-type semiconductor memory device in a burn-in stress system. Additionally, since the package-type semiconductor memory device is manually installed in the burn-in stress system, a labor force is required. Further, in the package burn-in stress test, the number of packages which simultaneously undergo the burn-in stress test is limited. In contrast, since the wafer burn-in stress test can be performed with respect to a plurality of sheets of wafers having several dies, the wafer burn-in stress test has an advantage in terms of test efficiency. As described above, since the wafer burn-in stress test can be performed within a short period of time as compared with the conventional package burn-in stress test, the wafer burn-in stress test is extensively used.

FIG. 1 is a block diagram illustrating a column decoder stress test circuit 100 used in a conventional wafer burn-in test. Referring to FIG. 1, the column decoder stress test circuit 100, according to a conventional circuit, includes first to third predecoders 10 to 30, an even decoder 40, and an odd decoder 50. The first to third predecoders 10 to 30 receive and decode column addresses 'BYA<1:2>', 'BYA<3:5>', and 'BYA<6:8>', respectively. The use of several predecoders such as the first to third predecoders 10 to 30 is necessary to reduce the number of gates of the even decoder 40 and the odd decoder 50.

The even decoder 40 receives outputs from the first to third predecoders 10 to 30 and outputs the even column selection signals 'Yi<0>', 'Yi<2>', 'Yi<4>', 'Yi<6>', . . . , and 'Yi<2n>'. The odd decoder 50 receives the outputs from the first to third predecoders 10 to 30 and outputs the odd column selection signals 'Yi<1>', 'Yi<3>', 'Yi<5>', 'Yi<7>', . . . , and 'Yi<2n+1>'. Accordingly, the even column selection signals 'Yi<0>', 'Yi<2>', 'Yi<4>', 'Yi<6>', . . . , and 'Yi<2n>' are arranged adjacent to each other, and the odd column selection signals 'Yi<1>', 'Yi<3>', 'Yi<5>', 'Yi<7>', . . . , and 'Yi<2n+1>' are also arranged in adjacent to each other.

Referring to FIG. 2, the first predecoder 10 includes a plurality of NOR gates and a plurality of AND gates. In detail, the first predecoder 10 includes a plurality of NOR gates to receive and decode the column addresses 'BYA<1>' and 'BYA<2>' and a plurality of AND gates to receive outputs of the NOR gates and an active pulse 'AYP16'. The active pulse 'AYP16' is a pulse signal, and occurs by the number of burst lengths (BLs) in a write or read operation. Accordingly, as shown in FIG. 2, the first predecoder 10 receives the two column addresses 'BYA<1:2>' to output four signals 'YA12<0:3>'.

Referring to FIG. 3, the second predecoder 20 includes a plurality of NOR gates and a plurality of AND gates. In detail, the second predecoder 20 includes a plurality of NOR gates and a plurality of AND gates to receive and decode the column addresses BYA<3:5>. Accordingly, as shown in FIG. 3, the second predecoder 20 receives the three column addresses 'BYA<3:5>' and outputs eight signals 'YA345<0:7>'.

Referring to FIG. 4, the third predecoder 30 includes a plurality of NOR gates and a plurality of AND gates. In detail, the third predecoder 30 includes a plurality of NOR gates and a plurality of AND gates to receive and decode the column addresses 'BYA<6:8>'. Accordingly, as shown in FIG. 4, the third predecoder 30 receives the three column addresses 'BYA<6:8>' and outputs eight signals 'YA678<9:7>'. Accordingly, the even decoder 40 and the odd decoder 50 receive the outputs of the first to third predecoders 10 to 30 and output the 256 column selection signals 'Yi<0>', . . . , 'Yi<255>'.

Accordingly, a conventional column decoder stress test circuit enables only the column selection signals corresponding to the information about the column addresses and disables other column selection signals so as to perform a test. Thus, in a conventional wafer burn-in test, only one column selection signal is enabled, and therefore the wafer burn-in test is performed relative to one column line. Additionally, the wafer burn-in test may not be performed, or the wafer burn-in test is performed by enabling only one column selection signal. Therefore, it is difficult to provide sufficient stress to all column lines during a wafer burn-in test. As a result, when the wafer burn-in test is performed according to the related art, an exact test result cannot be obtained in a test such as early failure rate (EFR), a high temperature operating life (HTOL), or a low temperature operating life (LTOL), which is a kind of a package test or a reliability test. Accordingly, contact defect may occur or function fail or DC current fail (IDD fail) may occur through a line bridge.

SUMMARY

A multi-column decoder stress test circuit capable of reducing a column stress test time while sufficiently performing a stress test by using column selection signals is described herein.

According to one aspect, a multi-column decoder stress test circuit can include a control unit configured to receive at least one column test signal and generate a multi-column enable signal, and a multi-enable decoding unit which can receive the multi-column enable signal to generate a plurality of enabled column selection signals.

According to another aspect, a multi-column decoder stress test circuit can include a first predecoder which can receive and decode an all-column test signal, a first adjacent column test signal, a second adjacent column test signal, and a portion of column addresses to output a multi-enable signal and a control coding signal, a second predecoder which can receive and decode remaining column addresses excluding the column addresses received in the first predecoder, according to the multi-column enable signal to output a main coding signal, and a main decoder which can receive and decode the control coding signal and the main coding signal to output a column selection signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 5:
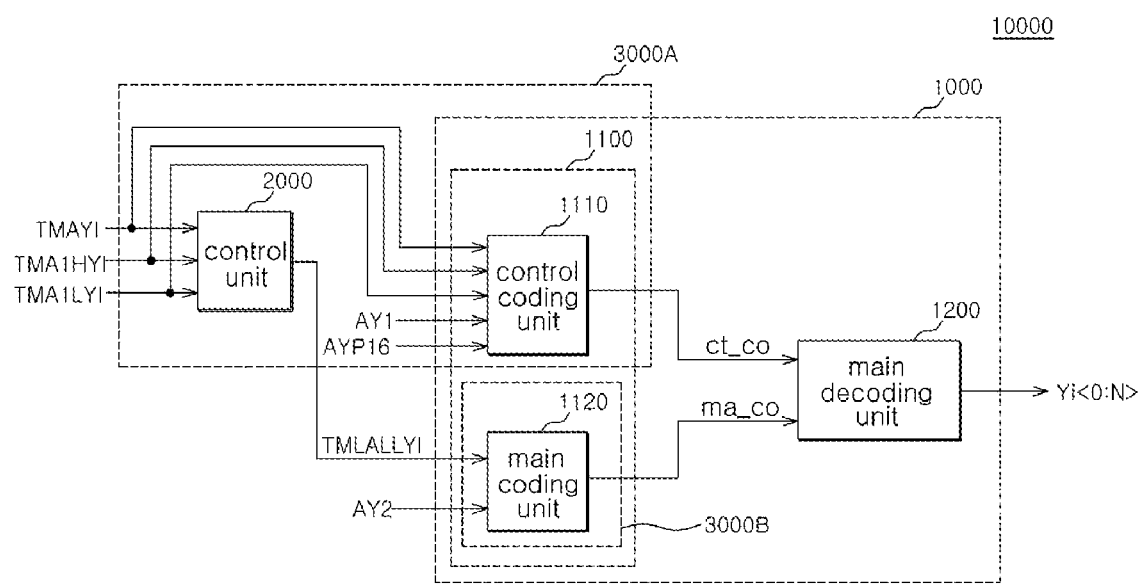
FIG. 5 is a block diagram illustrating a multi-column decoder stress test circuit according to the descriptions herein.

FIG. 5 is a block diagram illustrating a multi-column decoder stress test circuit according to the descriptions herein. Referring to FIG. 5, a multi-column decoder stress test circuit 10000 can include a first predecoder 3000A, a second predecoder 3000B, and a main decoding unit 1200.

The first predecoder 3000A can receive and decode an all-column test signal 'TMAYI', a first adjacent column test signal 'TMA1HYI', a second adjacent column test signal 'TMA1LYI', an active pulse 'AYP16', and first column addresses AY1, and output a multi-column enable signal 'TMLALLYI' and control coding signals 'ct_co'. Such a first predecoder 3000A can also include a control unit 2000 and a control coding unit 1110.

The second predecoder 3000B can receive and decode second column addresses AY2 according to the multi-column enable signal 'TMLALLYI', and output main control coding signals 'ma_co'. The second predecoder 3000B can include a main coding unit 1120. The control coding unit 1110 of the first predecoder 3000A and the main coding unit 1120 of the second predecoder 3000B can serve as a multi-enable predecoding unit 1100, and the multi-enable predecoding unit 1100 and the main decoding unit 1200 can serve as a multi-enable decoding unit 1000. The main decoding unit 1200 can receive the control coding signals 'ct_co' and the main coding signals 'ma_co' to perform a decoding operation, and thereby output column selection signals 'Yi<0:N>'.

The control unit 2000 can generate the multi-column enable signal 'TMLALLYI' according to at least one of the column test signals 'TMAYI', 'TMA1HYI', and 'TMA1LYI'. The column test signals 'TMAYI', 'TMA1HYI', and 'TMA1LYI' can be enabled when a stress test is performed with respect to a column line. For example, the column test signals may include the all-column test signal 'TMAYI', the first adjacent column test signal 'TMA1HYI', and the second adjacent column test signal 'TMA1LYI'.

The all-column test signal 'TMAYI' is enabled in a test mode to enable all column selection signals 'Yi<0:N>'. For example, when the main decoding unit 1200 includes an even decoder and an odd encoder, the first adjacent column test signal 'TMA1HYI' can be enabled in a test mode to enable even column selection signals 'Yi<2>', 'Yi<6>', ..., and 'Yi<4n+2>' among column selection signals 'Yi<0>', 'Yi<2>', 'Yi<4>', 'Yi<6>', ..., and 'Y<2n>' which are outputs of the even decoder. The first adjacent column test signal 'TMA1HYI' can enable the even column selection signals 'Yi<3>', 'Yi<7>', ..., and 'Yi<4n+3>' among column selection signals 'Yi<1>', 'Yi<3>', 'Yi<5>', 'Yi<7>', ..., 'Yi<2n+1>' which are outputs of the odd decoder.

The second adjacent column test signal 'TMA1LYI' can be enabled in a test mode to enable odd column selection signals 'Yi<0>', 'Yi<4>', ..., and 'Yi<4n>' among the column selection signals 'Yi<0>', 'Yi<2>', 'Yi<4>', 'Yi<6>', ..., and 'Yi<2n>' which are outputs of the even decoder. The second adjacent column test signal 'TMA1LYI' can enable the odd column selection signals 'Yi<1>', 'Yi<5>', ..., and 'Yi<4n+1>' among the column selection signals 'Yi<0>', 'Yi<1>', 'Yi<3>', 'Yi<5>', ..., and 'Yi<2n+1>' which are outputs of the odd decoder. All column test signals 'TMAYI', 'TMA1HYI', and 'TMA1LYI' have levels. If the column test signals 'TMAYI', 'TMA1HYI', and 'TMA1LYI' are enabled, the column test signals 'TMAYI', 'TMA1HYI', and 'TMA1LYI' can maintain a high level until a test is terminated (in contrast, the column test signals 'TMAYI', 'TMA1HYI', and 'TMA1LYI' can maintain a low level).

The control unit 2000 can enable and output the multi-column enable signal 'TMLALLYI' if at least one of the all-column test signal 'TMAYI', the first adjacent column test signal 'TMA1HYI', and the second adjacent column test signal 'TMA1LYI' is enabled.

Figure 6:
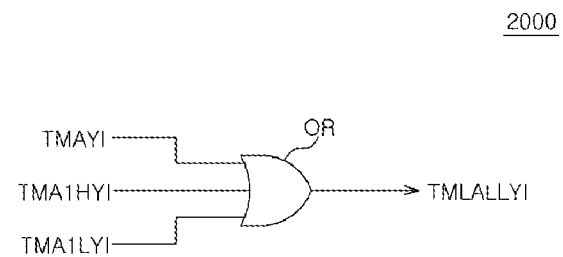
FIG. 6 is a detailed circuit diagram illustrating a control unit that can be included in the test circuit of FIG. 5.

FIG. 6 is a detailed circuit diagram illustrating a control unit that can be included in the test circuit of FIG. 5. Referring to FIG. 6, the control unit 2000 can be realized by using an OR gate. If at least one of the all-column test signal 'TMAYI', the first adjacent column test signal 'TMA1HYI', and the second adjacent column test signal 'TMA1LYI' is enabled, the multi-column enable signal 'TMLALLYI' can be enabled through the OR gate.

The multi-enable decoding unit 1000 can include the multi-enable predecoding unit 1100 and the main decoding unit 1200 can receive the multi-column enable signal 'TMLALLYI' to output the plural enabled column selection signals 'Yi<0:N>'.

The multi-enable predecoding unit 1100 can receive the first and second column addresses ay1 and 'AY2' according to the active pulse 'AYP16' and the multi-column enable signal 'TMLALLYI' and can output the coding signals 'ct_co' and 'ma_co'. The active pulse 'AYP16' can be a pulse signal, and can occur by the number of burst lengths (BLs) in a write or read operation. For example, if the BLs is four (4), the active pulse 'AYP16' can be enabled in a high level four times. During the high-level active pulse 'AYP16', the write or read operation can be performed. During the low-level active pulse 'AYP16', the multi-column test may be performed.

According to the column test signals 'TMAYI', 'TMA1HYI', and 'TMA1LYI', the multi-enable predecoding unit 1100 can enable all column selection signals 'Yi<0:N>', or only the even or odd column selection signals.

As described above, the multi-enable predecoding unit 1100 may include the control coding unit 1110 and the main coding unit 1120. The control coding unit 1110 can receive the first column address AY1 among the first and second column addresses AY1 and AY2 according to the column test signals 'TMAYI', 'TMA1HYI', and 'TMA1LYI' and the multi-column enable signal 'TMLALLYI' to output the plural control coding signals 'ct_co'.

The main coding unit 1120 receives the second column addresses AY2 among the first and second column addresses AY1 and AY2 according to the multi-column enable signal 'TMLALLYI' to output the plural main coding signals 'ma_co'.

Figure 7:
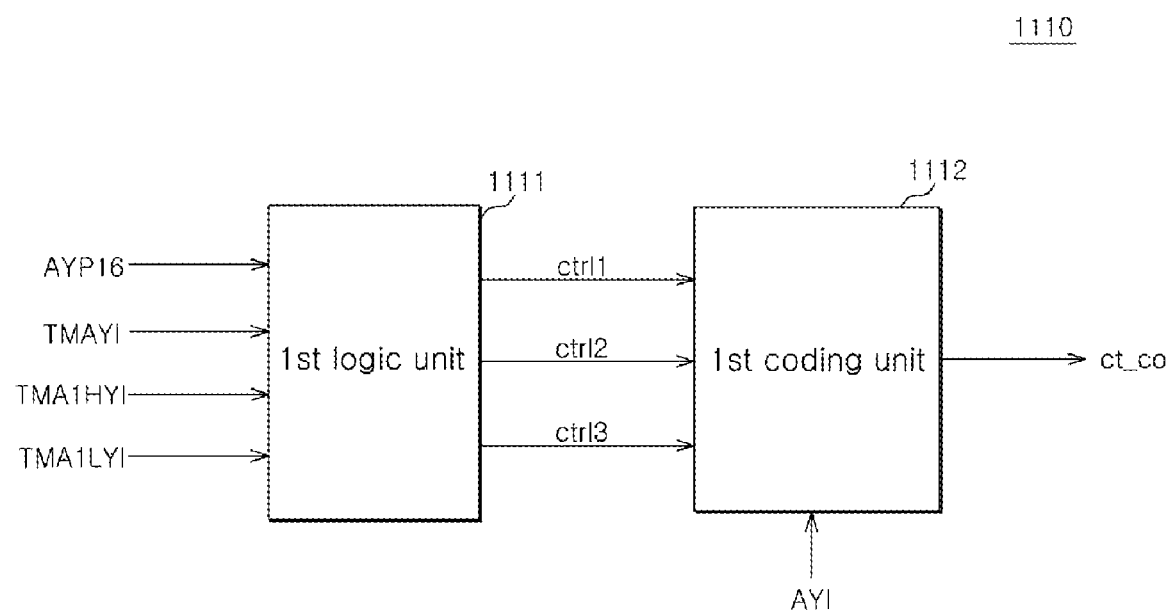
FIG. 7 is a detailed block diagram illustrating a control coding unit that can be included in the test circuit of FIG. 5.

Referring to FIG. 7, the control coding unit 1110 includes a first logic unit 1111 and a first coding unit 1112.

The first logic unit 1111 receives the active pulse 'AYP16', the all-column test signal 'TMAY1', the first adjacent column test signal 'TMA1HYI', and the second adjacent column test signal 'TMA1LYI' to output first to third control signals 'ctrl1', 'ctrl2', and 'ctrl3'.

The first coding unit 1112 can receive the first column addresses AY1 according to the first to third control signals 'ctrl1', 'ctrl2', and 'ctrl3' to output the control coding signals 'ct_co'.

Figure 8:
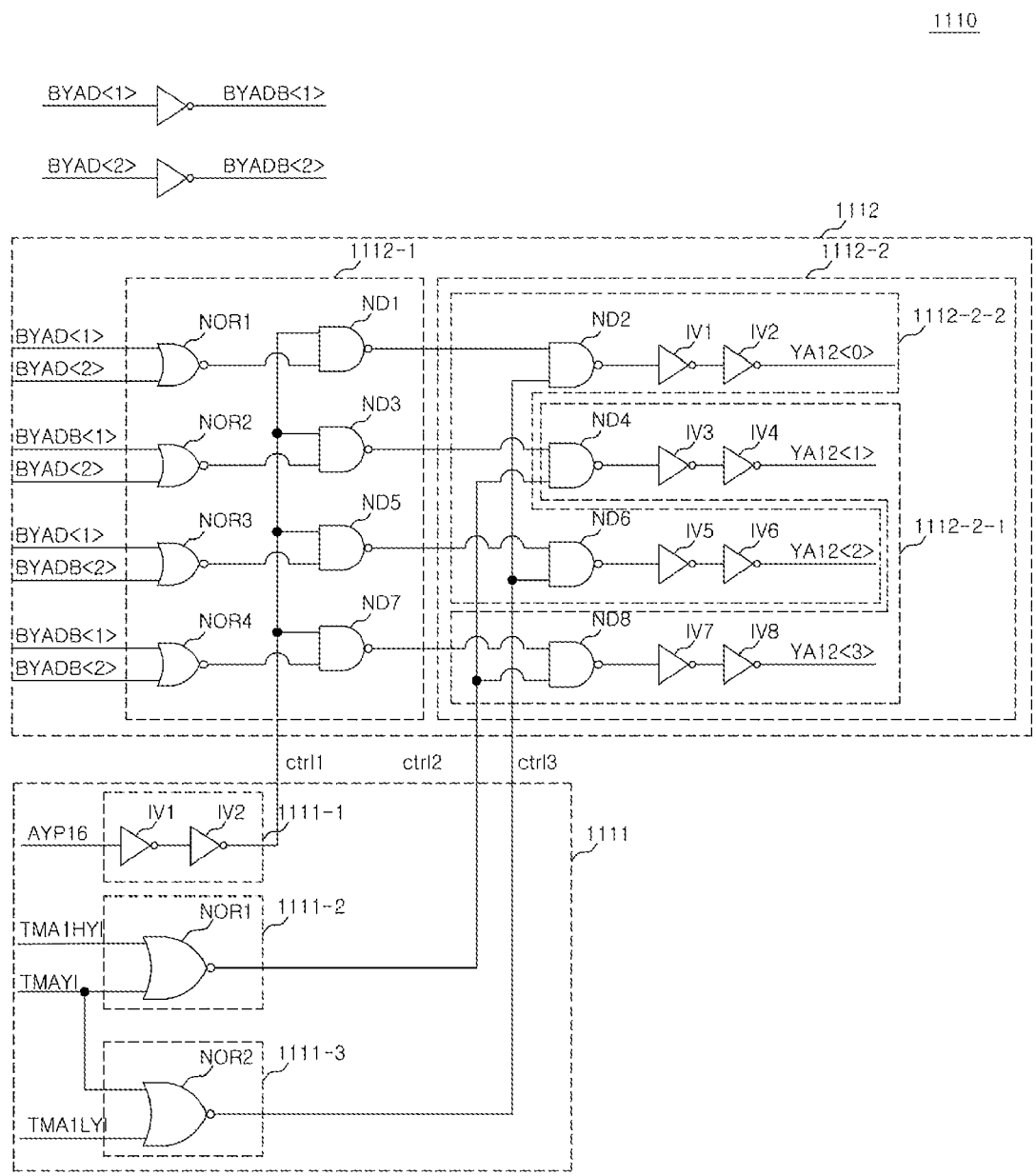
FIG. 8 is a detailed circuit diagram illustrating a control coding unit that can be included in the test circuit of FIG. 7.

FIG. 8 is a detailed circuit diagram illustrating a control coding unit that can be included in the test circuit of FIG. 7. Referring to FIG. 8, the first logic unit 1111 can include an all-column control unit 1111-1, a first adjacent column control unit 1111-2, and a second adjacent column control unit 1111-3. The all-column control unit 1111-1 can receive the active pulse 'AYP16' to output the first control signal 'ctrl1'. If the active pulse 'AYP16' is a low level, the all-column control unit 1111-1 can generate the low-level first control signal 'ctrl1'. For example, the all-column control unit 1111-1 can include first and second inverters IV1 and IV2. The first inverter IV1 can invert the active pulse 'AYP16'. The second inverter IV2 can invert the output of the first inverter IV1 to output the first control signal 'ctrl1'.

The first adjacent column control unit 1111-2 can receive the all-column test signal 'TMAY1' and the first adjacent column test signal 'TMA1HYI' to output the second control signal 'ctrl2'. If the all-column test signal 'TMAY1' or the first adjacent column test signal 'TMA1HYI' is enabled, the first adjacent column control unit 1111-2 can output the low-level second control signal 'ctrl2'.

The first adjacent column control unit 1111-2 can be realized by using a first NOR gate NOR1. The first NOR gate NOR1 of the first adjacent column control unit 1111-2 can receive the all-column test signal 'TMAY1' and the first adjacent column test signal 'TMA1HYI' to output the second control signal 'ctrl2'. In other words, when the first adjacent column test signal 'TMA1HYI' becomes a high level or the all-column test signal 'TMAY1' becomes a high level, the first NOR gate NOR1 of the first adjacent column control unit 1111-2 can output the low-level second control signal 'ctrl2'.

The second adjacent column control unit 1111-3 can receive the all-column test signal 'TMAY1' and the second adjacent column test signal 'TMA1LYI' to generate the third control signal 'ctrl3'. The second adjacent column control unit 1111-3 can output the low-level third control signal 'ctrl3' if the all-column test signal 'TMAYI' or the second adjacent column test signal 'TMA1LYI' is enabled.

As shown in FIG. 8, the second adjacent column control unit 1111-3 can include a second gate NOR2. The second NOR gate NOR2 of the second adjacent column control unit 1111-3 can receive the all-column test signal 'TMAY1' and the second adjacent column test signal 'TMA1LYI' to output the third control signal 'ctrl3'. In other words, when the second adjacent column test signal 'TMA1LYI' becomes a high level, or the all-column test signal 'TMAY1' becomes a high level, the second NOR gate NOR2 of the second adjacent column control unit 1111-3 can output the low-level third control signal 'ctrl3'.

Referring to FIG. 8, the first coding unit 1112 can includes an all-column address unit 1112-1 and an adjacent column address unit 1112-2. The all-column address unit 1112-1 can output high-level signals corresponding to a decoding number of the first column addresses 'BYAD<1>' and 'BYAD<2>' according to the first control signal 'ctrl1' regardless of information of the first column addresses 'BYAD<1>' and 'BYAD<2>'. For example, the all-column address unit 1112-1 can include first to fourth NOR gates NOR1 to NOR4 and first, third, fifth, and seventh NAD gates ND1, ND3, ND5, and ND7. This is a case in which the first column address has two bits. As the bit number of the first column address increases, the number of the NOR gates and the NAND gates increase.

The first to fourth NOR gates NOR1 to NOR4 of the all-column address unit 1112-1 can receive the first column addresses 'BYAD<1>' and 'BYAD<2>' and the inverted signals 'BYADB<1>' and 'BYADB<2>' thereof and can perform a NOR operation for the first column addresses 'BYAD<1>' and 'BYAD<2>' and the inverted signals 'BYADB<1>' and 'BYADB<2>'. The first, third, fifth, and seventh NAND gates ND1, ND3, ND5, and ND7 of the all-column address unit 1112-1 can receive the first control signal 'ctrl1' and the outputs of the first to fourth NOR gates NOR1 to NOR4 and can perform a NAND operation for the first control signal 'ctrl1' and the outputs of the first to fourth NOR gates NOR1 to NOR4. When the first control signal 'ctrl1' is a low level, the first, third, fifth, and seventh NAND gates ND1, ND3, ND5, and ND7 of the all-column address unit 1112-1 can output high-level signals regardless of the information about the first column addresses 'BYAD<1>' and 'BYAD<2>'. Therefore, according to the embodiments described herein, the multi-column test is possible.

The adjacent column address unit 1112-2 can receive the outputs of the all-column address unit 1112-1 to output the control coding signals 'YA12<0:3>' according to the control signals 'ctrl2' and 'ctrl3'. The adjacent column address unit 1112-2 can include a first adjacent column address unit 1112-2-1 and a second adjacent column address unit 1112-2-2.

The first adjacent column address unit 1112-2-1 can output the low-level control coding signals 'YA12<1>' and 'YA12<3>' if the second control signal 'ctrl2' is enabled. Accordingly, when the all-column test signal 'TMAY1' or the first adjacent column test signal 'TMA1HYI' is a high level, the first adjacent column address unit 1112-2-1 can output the high-level control coding signals 'YA12<1>' and 'YA12<3>'. When the low-level active pulse 'AYP16' and the high-level first adjacent column test signal 'TMA1HYI' are applied, the first control signal 'ctrl1' becomes a low level, the second control signal 'ctrl2' becomes a low level, and the third control signal 'ctrl3' becomes a high level. Accordingly, the first and third control coding signals 'YA12<0>' and 'YA12<2>' can become a low level, and the second and fourth control coding signal 'YA12<1>' and 'YA12<3>' become a high level.

The first adjacent column address unit 1112-2-1 can include a fourth NAND gate ND4, an eighth NAND gate ND8, third, fourth, and seventh inverters IV3, IV4, and IV7, and an eighth inverter IV8. The fourth and eighth NAND gates ND4 and ND8 of the first adjacent column address unit 1112-2-1 can receive the second control signal 'ctrl2' and the outputs of the all-column address unit 1112-1 and can perform a NAND operation for the second control signal 'ctrl2' and the outputs of the all-column address unit 1112-1. The third inverter IV3 of the first adjacent column address unit 1112-2-1 can invert the output of the fourth NAND gate ND4, and the fourth inverter IV4 can invert the output of the third inverter IV3 to output the second control coding signal 'YA12<1>'. The seventh inverter IV7 can invert the output of the eighth NAND gate ND8, and the eighth inverter IV8 can invert the output of the seventh inverter IV7 to output the fourth control coding signal 'YA12<3>'.

The second adjacent column address unit 1112-2-2 can output the high-level control coding signals 'YA12<0>' and 'YA12<2>' if the third control signal 'ctrl3' is enabled. Accordingly, when the all-column test signal 'TMAY1' or the second adjacent column test signal 'TMA1LYI' is a high level, the second adjacent column address unit 1112-2-2 can output the high-level control coding signals 'YA12<0>' and 'YA12<2>'. For example, when the low-level active pulse 'AYP16' and the high-level second adjacent column test signal 'TMA1LYI' are applied, the first control signal 'ctrl1' can become a low level, the second control signal 'ctrl2' can become a high level, and the third control signal 'ctrl3' can become a low level. Accordingly, the first and third control coding signals 'YA12<0>' and 'YA12<2>' can become a high level, and the second and fourth control coding signal 'YA12<1>' and 'YA12<3>' can become a low level.

The second adjacent column address unit 1112-2-2 can be realized by using a second NAND gate ND2, a sixth NAND gate ND6, first, second, and fifth inverters IV1, IV2, and IV5, and a sixth inverter IV6. The second and sixth NAND gates ND2 and ND6 of the second adjacent column address unit 1112-2-2 can receive the third control signal 'ctrl3' and the outputs of the all-column address unit 1112-1 and perform a NAND operation for the third control signal 'ctrl3' and the outputs of the all-column address unit 1112-1. The first inverter IV1 can invert the output of the second NAND gate ND2, and the second inverter IV2 can invert the output of the first inverter IV1 and can output the first control coding signal 'YA12<0>'. The fifth inverter IV5 can invert the output of the sixth NAND gate ND6, and the sixth inverter IV6 can invert the output of the fifth inverter IV5 to output the third control coding signal 'YA12<2>'.

Figure 9:
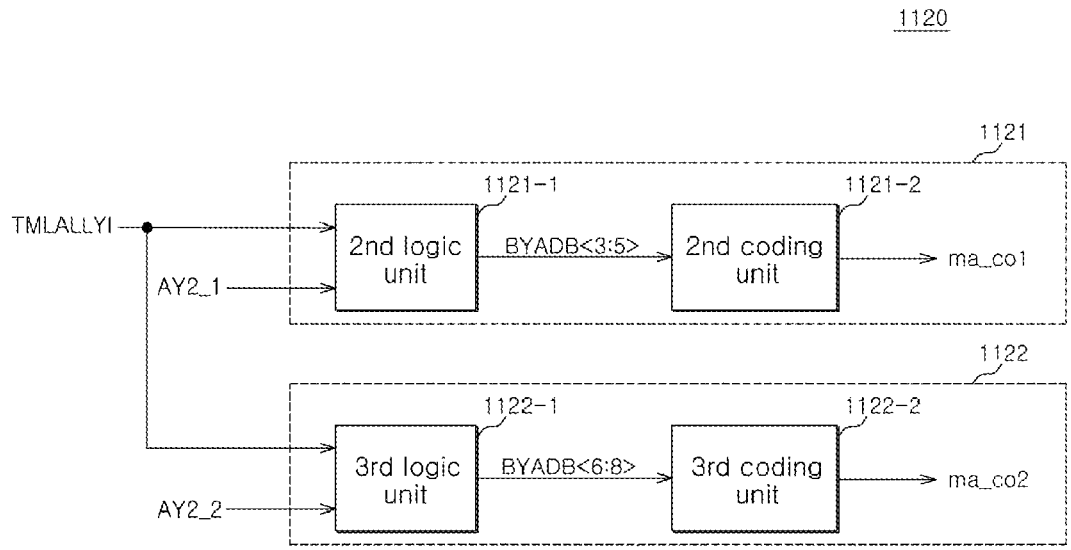
FIG. 9 is a detailed block diagram illustrating a main coding unit that can be included in the test circuit of FIG. 5.

FIG. 9 is a detailed block diagram illustrating a main coding unit that can be included in the test circuit of FIG. 5. Referring to FIG. 9, the main coding unit 1120 can include a first main coding unit 1121 and a second main coding unit 1122. The first main coding unit 1121 can receive a third column address 'AY2-1', which is a portion of the second column address 'AY2', according to the multi-column enable signal 'TMLALLYI' to output a first main coding signal 'ma_co1'.

The second main coding unit 1122 can receive a fourth column address 'AY2-2', which is a portion of the second column address 'AY2', instead of the third column address 'AY2-1' according to the multi-column enable signal 'TMLALLYI' and can output a second main coding signal 'ma_co2'.

The first main coding unit 1121 can includes a second logic unit 1121-1 and a second coding unit 1121-2. The second logic unit 1121-1 can receive the third column address AY2-1 according to the multi-column enable signal 'TMLALLYI' and can generate the third modified column addresses 'BYADB<3:5>'. The second logic unit 1121-1 can output the third modified column addresses 'BYADB<3:5>' and the inverted signals thereof as high-level signals when the multi-column enable signal 'TMLALLYI' is enabled.

The second coding unit 1121-2 can receive the third modified column addresses 'BYADB<3:5>' and can generate the first main coding signal 'ma_co1' which is a portion of the main coding signals 'ma_co'. The second coding unit 1121-2 can include a typical decoder circuit. Accordingly, the second coding unit 1121-1 can decode the third modified column address 'BYADB<3:5>' and the inverted signals thereof having a high level and can output the first main coding signal 'ma_co1' having a low level, when the multi-column enable signal 'TMLALLYI' is enabled.

The second main coding unit 1122 can include a third logic unit 1122-1 and a third coding unit 1122-2. The third logic unit 1122-1 can receive the fourth column address 'AY2-2' according to the multi-column enable signal 'TMLALLYI' and can generate the fourth modified column addresses 'BYADB<6:8>'. The third logic unit 1122-1 can output the fourth modified column addresses 'BYADB<6:8>' and inverted signals thereof as high-level signals when the multi-column enable signal 'TMLALLYI' is enabled.

The third coding unit 1122-2 can receive the multi-column enable signal 'TMLALLYI' and the fourth modified column addresses 'BYADB<6:8>' and can output the second main coding signal 'ma_co2'. Accordingly, the third coding unit 1122-2 can decode the fourth modified column address 'BYADB<6:8>' and the inverted signals thereof having a high level and can output the second main coding signal 'ma_co2' having a low level, when the multi-column enable signal 'TMLALLYI' is enabled.

Figure 10:
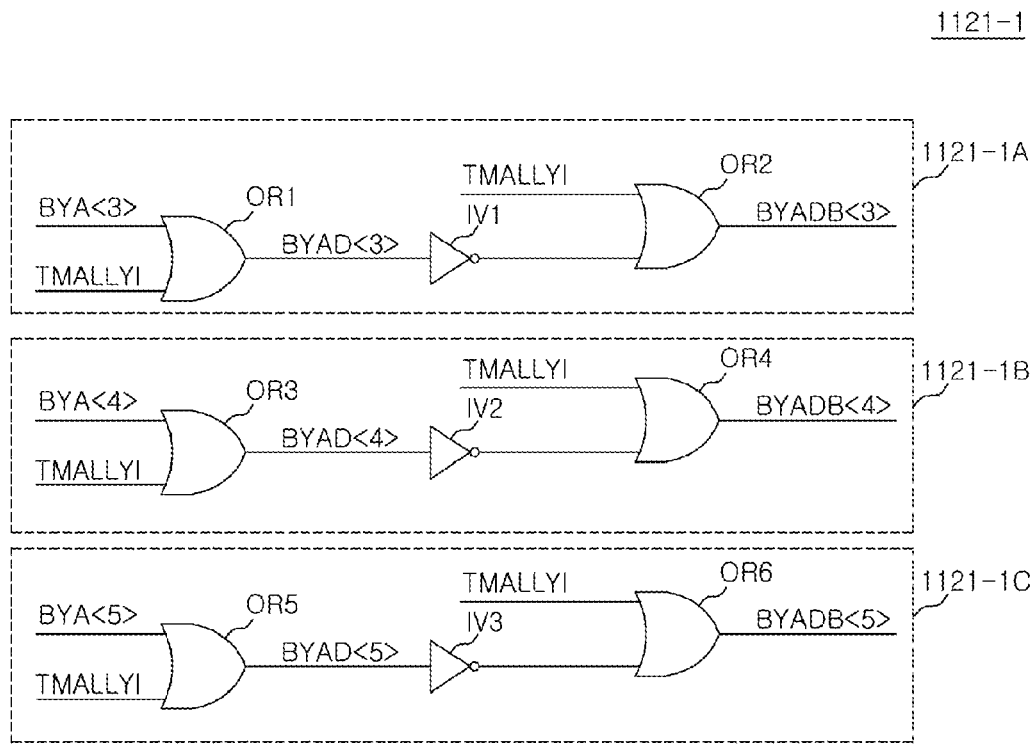
FIG. 10 is a detailed circuit diagram illustrating a second logic unit that can be included in the test circuit of FIG. 9.

Referring to FIG. 10, the second logic unit 1121-1 can include a plurality of second unit logic units 1121-1A, 1121-1B, and 1121-1C, and each of the second unit logic units 1121-1A, 1121-1B, and 1121-1C can have two OR gates and one inverter.

Hereinafter, the second unit logic section 1121-1A among the plural second unit logic sections 1121-1A, 1121-1B, and 1121-1C will be representatively described.

A first OR gate OR1 of the second unit logic section 1121-1A can receive one column address 'BYA<3>' of the third column addresses 'BYA<3:5>' and the multi-column enable signal 'TMLALLYI' and can perform an OR operation for the column address 'BYA<3>' and the multi-column enable signal 'TMLALLYI'. The second logic unit 1121-1 can employ the third column address 'AY2_1' having three bits (i.e., 'BYA<3:5>'). A first inverter IV1 of the second unit logic section 1121-1A can invert an output 'BYAD<3>' of the first OR gate OR1.

A second OR gate OR2 of the second unit logic section 1121-1A can receive the multi-column enable signal 'TMLALLYI' and an output of the first inverter IV1 and can perform an OR operation for the multi-column enable signal 'TMLALLYI' and the output of the first inverter IV1 and can output the third modified column address 'BYADB<3>' corresponding to the column address 'BYA<3>' among the third column addresses 'BYA<3:5>'.

Figure 11:
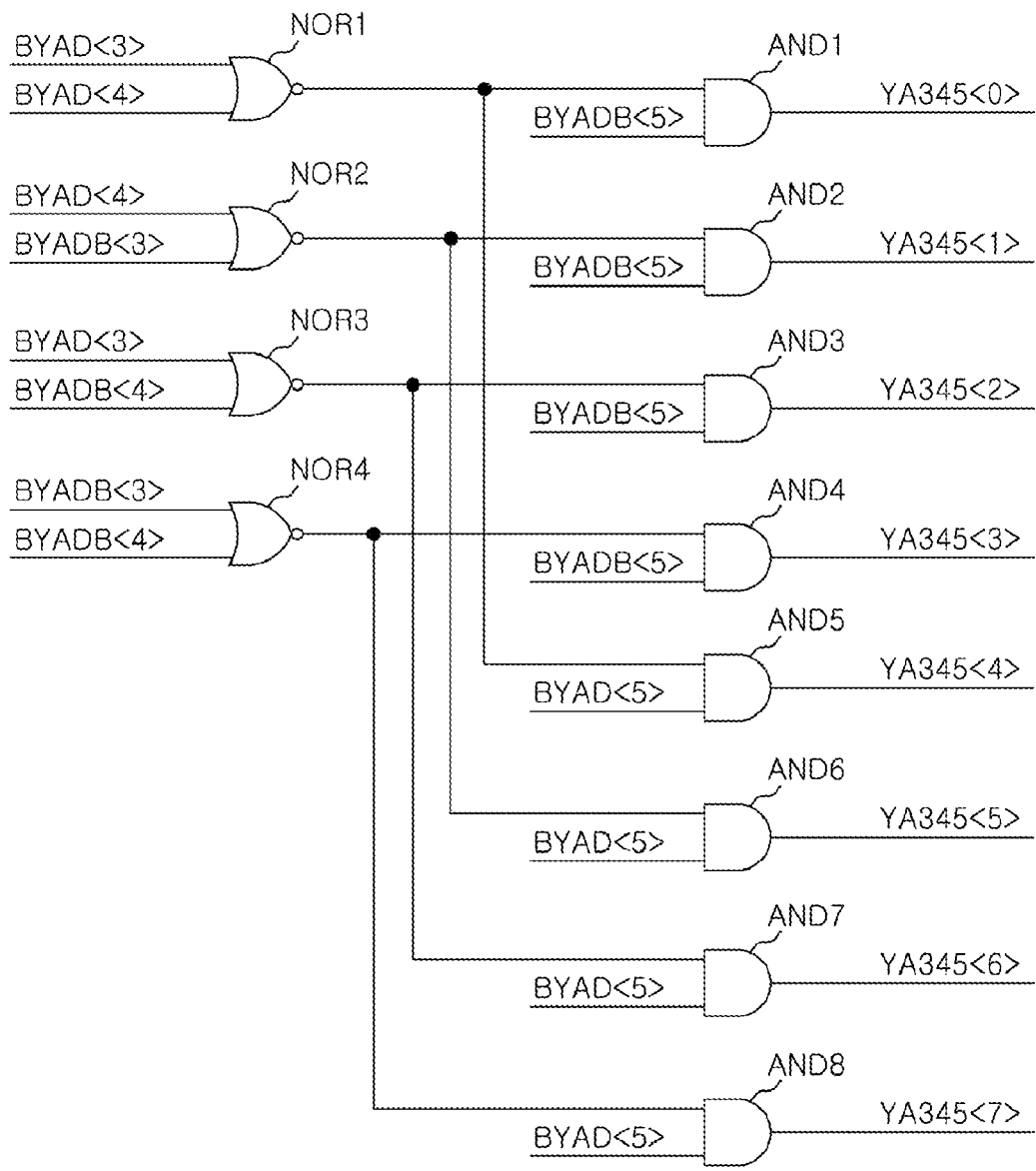
FIG. 11 is a detailed circuit diagram illustrating a second coding unit that can be included in the test circuit of FIG. 9.

FIG. 11 is a detailed circuit diagram illustrating a second coding unit that can be included in the test circuit of FIG. 9. Referring to FIG. 11, the second coding unit 1121-2 shown in FIG. 11 may be realized by using a conventional decoding circuit except that input signals are the third modified column addresses 'BYADB<3:5>'. The second coding unit 1121-2 may include a decoder to decode the third modified column addresses 'BYADB<3:5>' can be configured to output the first main coding signals 'YA345<0:7>' ('ma_co1'). The second coding unit 1121-1 may include a plurality of NOR gates NOR1 to NOR4 and a plurality of AND gates AND1 to AND8.

Figure 12:
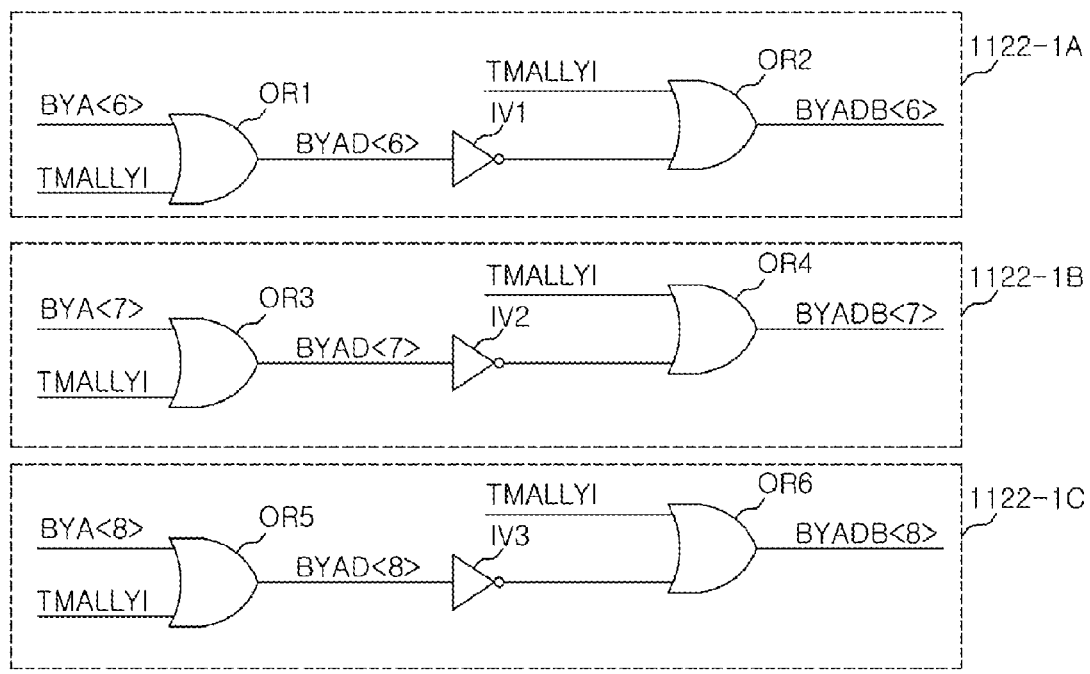
FIG. 12 is a detailed circuit diagram illustrating a third logic unit that can be included in the test circuit of FIG. 9.

FIG. 12 is a detailed circuit diagram illustrating a third logic unit that can be included in the test circuit of FIG. 9. Referring to FIG. 12, the third logic unit 1122-1 can include a plurality of third unit logic units 1122-1A, 1122-1B, and 1122-1C, and each of the third unit logic units 1122-1A, 1122-1B, and 1122-1C can have two OR gates and one inverter. Hereinafter, the third unit logic section 1122-1A and can output one address 'BYADB<6>' among the fourth modified column addresses 'BYADB<6:8>' will be representatively described.

A first OR gate OR1 of the third unit logic section 1122-1A can receive one column address 'BYA<6>' of the fourth column address 'BYA<6:8>' and the multi-column enable signal 'TMLALLYI' and can perform an OR operation for the column address 'BYA<6>' and the multi-column enable signal 'TMLALLYI'. The third logic unit 1122-1 shown in FIG. 12 can employ the fourth column address 'AY2_2' having three bits.

A first inverter IV1 of the third unit logic section 1122-1A can invert an output 'BYAD<6>' of the first OR gate OR1. A second OR gate OR2 of the third unit logic section 1122-1A can receive the multi-column enable signal 'TMLALLYI' and an output of the first inverter IV1 and can perform an OR operation for the multi-column enable signal 'TMLALLYI' and the output of the first inverter IV1 and can output one modified column address 'BYADB<3>' corresponding to the column address 'BYA<6>' among the fourth modified column addresses 'BYADB<6:8>'.

Figure 13:
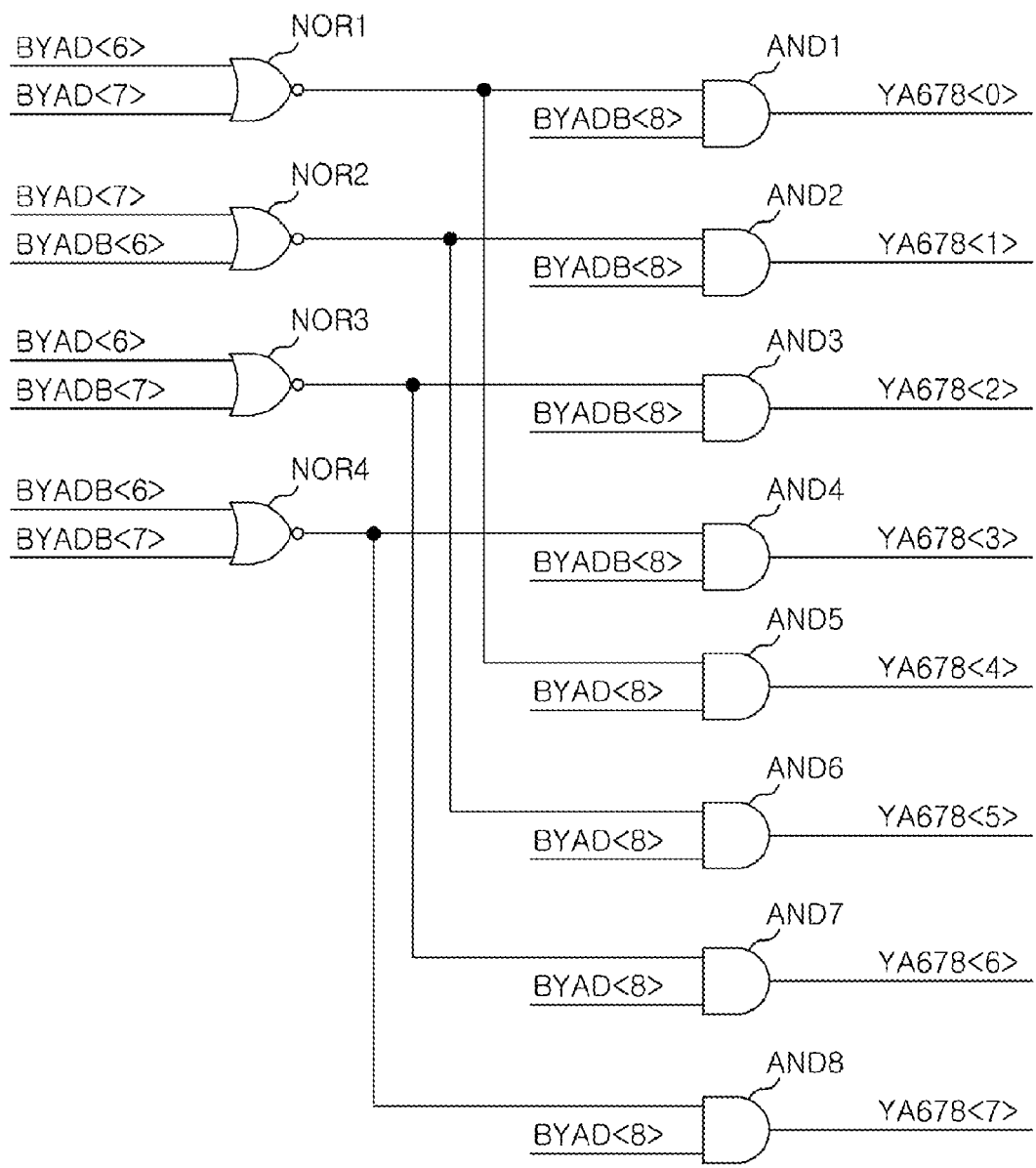
FIG. 13 is a detailed circuit diagram illustrating a third coding unit that can be included in the test circuit of FIG. 9.

FIG. 13 is a detailed circuit diagram illustrating a third coding unit that can be included in the test circuit of FIG. 9. Referring to FIG. 13, the third coding unit 1122-2 can be realized by using a decoder to decode the fourth modified column addresses 'BYADB<6:8>' to output the second main coding signals 'YA678<0:7>' ('ma_co2'). The third coding unit 1122-2 can include a plurality of NOR gates and a plurality of AND gates.

Figure 1:
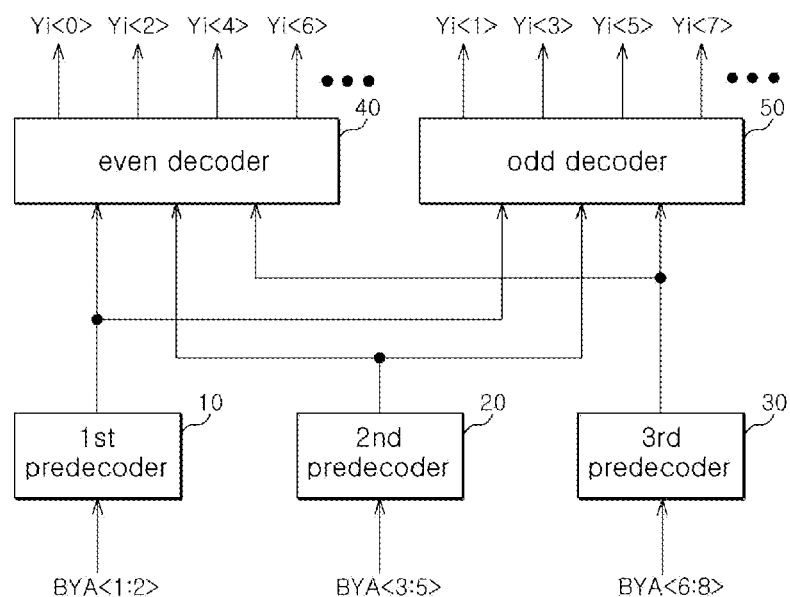
FIG. 1 is a block diagram illustrating a conventional column decoder stress test circuit.
Figure 2:
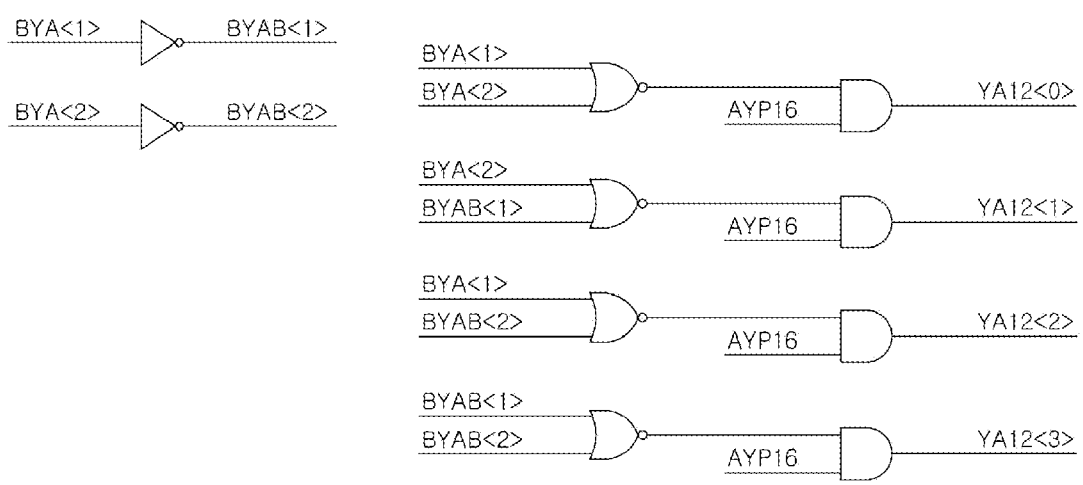
FIG. 2 is a detailed circuit diagram illustrating a first predecoder that can be included in the test circuit of FIG. 1.
Figure 3:
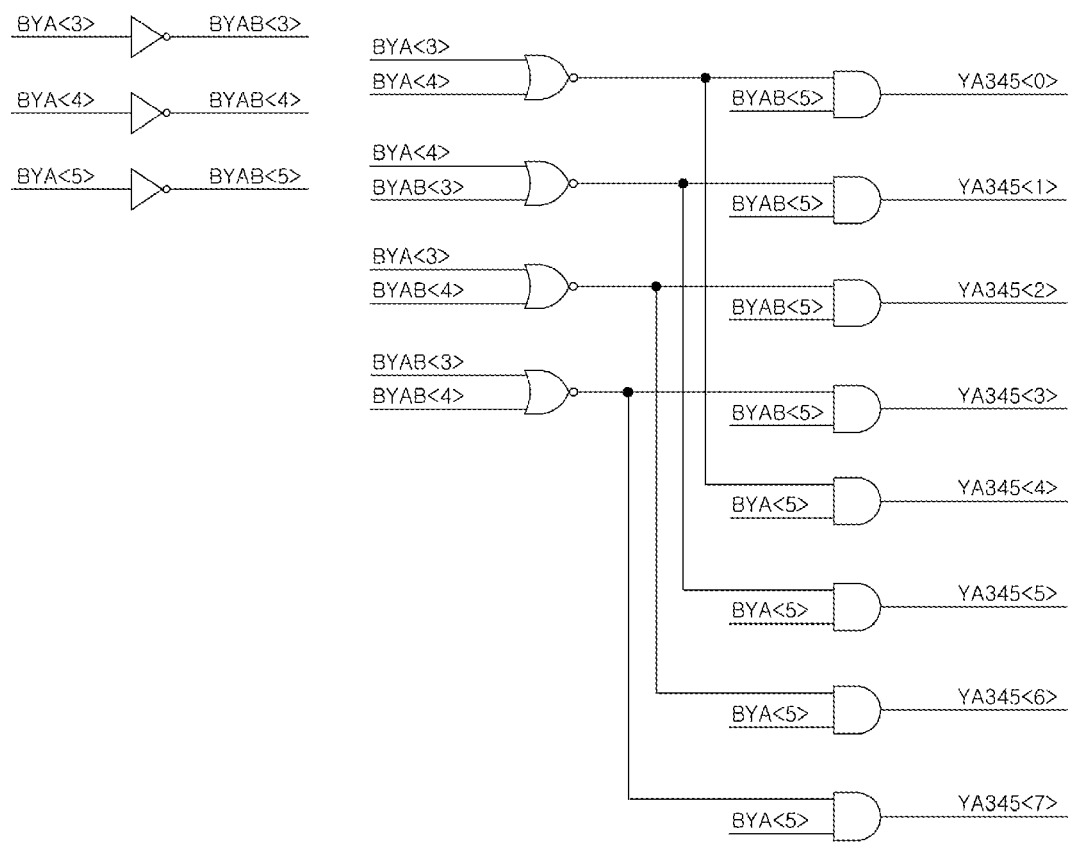
FIG. 3 is a detailed circuit diagram illustrating a second predecoder that can be included in the test circuit of FIG. 1.
Figure 4:
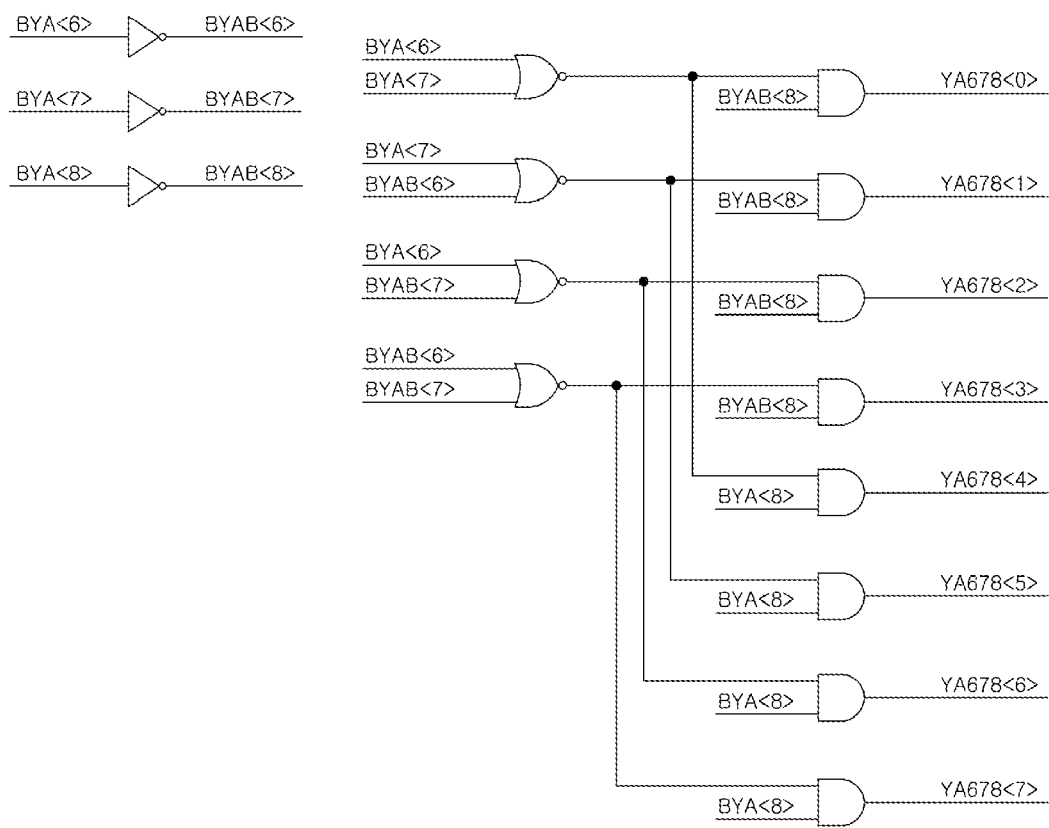
FIG. 4 is a detailed circuit diagram illustrating a third predecoder that can be included in the test circuit of FIG. 1.

The main decoding unit 1200 can receive and decode the coding signals 'ct_co' and the 'ma_co' and can output the column selection signals 'Yi<0:N>'. As shown in FIG. 1, the main decoding unit 1200 can include an even decoder and an odd decoder. The even decoder outputs 'Yi<0>', 'Yi<2>', 'Yi<4>', . . . , and 'Yi<2n>' among the column selection signal 'Yi<0:N>', and the odd decoder outputs 'YI<1>', 'YI<3>', 'YI<5>', . . . , and 'Yi<2n+1>' among the column selection signal 'Yi<0:N>'.

In a normal operation mode, the all-column test signal 'TMAYI', the first adjacent column test signal 'TMA1HYI', and the second adjacent column test signal 'TMA1LYI' can have a low level. Accordingly, the multi-column enable signal 'TMLALLYI' can become a low level. If the active pulse 'AYP16' becomes a high level, a read or write operation is performed. The control coding unit 1100 can receive and decode the first column address 'BYAD<1:2>' to output the control coding signals 'YA12<0:3>' corresponding to the first column address 'BYAD<1:2>'. In this case, since the all-column test signal 'TMAYI', the first adjacent column test signal 'TMA1HYI', and the second adjacent column test signal 'TMA1LYI' have a low level, the second and third control signals 'ctrl2' and 'ctrl3' can become high-level signals. Accordingly, the second, fourth, sixth, and eighth NAND gates ND2, ND4, ND5, and ND8 of the control coding unit 1110 shown in FIG. 8 serve as an inverter and can invert outputs of the first, third, fifth, and seventh NAND gates ND1, ND3, ND5, and ND7 of the control coding unit 1110. Therefore, the control coding unit 1110 can output signals, which can be obtained by decoding the first column addresses 'BYAD<1:2>', as the control coding signals 'YA12<0:3>'. In addition, since the multi-column enable signal 'TMLALLYI' has a low level, the second and third logic units 1121-1 and 1122-1 of the main coding unit 1120 can output the second column addresses 'BYAD<3:5>' and 'BYAD<6:8>' and their inverted signals. In addition, the second and third coding units 1121-2 and 1122-2 can decode the above signals. Accordingly, the main decoding unit 1200 receives and decodes the control coding signals 'YA12<0:3>' and the main coding signals 'YA345<0:7>' and 'YA678<0:7>' to enable the column selection signals corresponding to the column addresses, thereby performing the normal-mode operation.

In addition, hereinafter, the operation of the multi-column decoder stress test circuit in a column test mode, according to one embodiment, will be described. First, when the all-column test is performed, the all-column test signal 'TMAY1' can become a high level, such that the multi-column enable signal 'TMLALLYI' can also become a high level. Due to the test mode, the active pulse 'AYP16' can become a low level, so that the first control signal 'ctrl1' can also be a low-level signal. Accordingly, the all-column address unit 1112-1 of the control coding unit 1110 can output the high-level signals. In addition, since the all-column test signal 'TMAYI' is a high-level signal, the second control signal 'ctrl2' and the third control signal 'ctrl3' can become low level signals. Accordingly, the adjacent column address unit 1112-2 can output the control coding signals 'YA12<0:3>', all of which can have a high level. In addition, since the multi-column enable signal 'TMLALLYI' is a high-level signal, the second logic unit 1121-1 and the third logic unit 1122-1 can be provided in the main coding unit 1120 output signals, all of which can have a high level, and the second coding unit 1121-2 and the third coding unit 1122-2 receiving the above high-level signals can output the coding signals 'YA345<0:7>' and 'YA678<0:7>, all of which can have a low level. Accordingly, the main decoding unit 1200 can receive the control coding signals 'YA12<0:3>' and the main coding signals 'YA345<0:7>' and 'YA678<0:7>' to output the column selection signals 'Yi<0:N>', all of which are enabled.

When the first adjacent column test signal 'TMA1HYI' is a high-level signal, the multi-column enable signal 'TMLALLYI' can become a high level. In addition, the active pulse 'AYP16' can have a low level in a test mode, so that the all-column address unit 1112-1 provided in the control coding unit 1100 can output signals, all of which have a high level. In addition, since the second control signal 'ctrl2' has a low level, and the third control signal 'ctrl3' has a high level, the second and fourth control coding signals 'YA12<1>' and 'YA12<3>' can become a high level, and the first and third control coding signals 'YA12<0>' and 'YA12<3>' can become a low level. In addition, similar to a case in which the all-column test signal 'TMAYI' is a high-level signal, the main coding unit 1120 can output the main coding signals 'YA345<0:7>' and 'YA678<0:7>', all of which can have a high level. Accordingly, the main decoding unit 1200 can receive the control coding signals 'YA12<0:3>' and the main coding signals 'YA345<0:7>' and 'YA678<0:7>' and can enable a portion of the column selection signals 'Yi<2>', 'Yi<6>', . . . , and 'Yi<4n+2>' (even decoder) or 'Yi<3>', 'Yi<7>', . . . , and 'Yi<4n+3>' (odd decoder). In other words, when the first adjacent column test signal 'TMA1HYT' becomes a high level, the enable column lines and the disable column lines can be alternately arranged according to the arrangement sequence of the column selection signals to perform the multi-column test.

In addition, different from the case of the high-level first adjacent column test signal 'TMA1HYT', when the second adjacent column test signal 'TMA1LYT' becomes a high level, the second and fourth control coding signals 'YA12<1>' and 'YA12<3>' can become a low level, and the first and third control coding signals 'YA12<0>' and 'YA12<2>' can become a high level. Accordingly, the main decoding unit 1200 can enable a portion of the column selection signals 'Yi<0>', 'Yi<4>', . . . and 'Y<4n>' (even decoder) and 'Yi<1>', 'Yi<5>', . . . and 'Y<4n+1>' (odd decoder). In other words, when the second adjacent column test signal 'TMA1LYT' can become a high level, the disable column lines and the enable column lines are alternately arranged according to the arrangement sequence of the column selection signals to perform the multi-column test.

In one embodiment, a multi-column decoder stress test circuit includes a control unit which receives at least one column test signal to generate a multi-column enable signal, and a multi-enable decoding unit which receives the multi-column enable signal to generate a plurality of enabled column selection signals.

The multi-column decoder stress test circuit is adaptable for all semiconductor integrated circuit subject to a wafer burn-in stress test. Since the multi-column decoder stress test circuit can perform the stress test relative to a plurality of column lines at a time, it is possible to effectively screen a contact bridge of a column selection signal, the bridge between adjacent column selection signals, and the bridge between an adjacent power line and an adjacent column selection signal in a wafer burn-in test within a short period of time. Accordingly, multi-column decoder stress test circuit, according to the embodiments described herein can reduce the failure rate in an early failure rate (EFR), a high temperature operating life (HTOL), or a low temperature operation life (LTOL). Thus increasing the effectiveness and reliability of a product yield test or a reliability test after a semiconductor package is burned-in.

While certain embodiments have been described above, it will be understood that the embodiments described are by way of example only. Accordingly, the descriptions herein should not be limited based on the described embodiments. Rather, the descriptions herein should only be limited in light of the claims that follow when taken in conjunction with the above description and accompanying drawings.

What is claimed is:

1. A multi-column decoder stress test circuit comprising:
   a control unit configured to receive a plurality of column test signals and generate a multi-column enable signal; and
   a multi-enable decoding unit coupled to the control unit, the multi-enable decoding unit configured to receive the multi-column enable signal and the plurality of column test signals and to generate a plurality of enabled column selection signals,
   wherein the multi-enable decoding unit comprises:
      a multi-enable predecoding unit configured to receive column addresses according to the multi-column enable signal and the column test signals and to output coding signals; and
      a main decoding unit coupled to the multi-enable predecoding unit, the main decoding unit configured to receive and decode the coding signals and to output the column selection signal, and
   wherein the coding signals include a plurality of control coding signals and a plurality of main coding signals, and wherein the multi-enable predecoding unit comprises:
      a control coding unit configured to receive the first column addresses, which are a portion of the column addresses, according to the column test signals and the multi-column enable signal, and to output the control coding signals; and
      a main coding unit coupled to the control coding unit, the main coding unit configured to receive second column addresses, which are remaining column addresses excluding the first column addresses, according to the multi-column enable signal, and to output the main coding signals.

2. The multi-column decoder stress test circuit of claim 1, wherein the plurality of column test signals include an all-column test signal, a first adjacent column test signal, and a second adjacent column test signal.

3. The multi-column decoder stress test circuit of claim 2, wherein the control unit is configured to output the multi-column enable signal enabled if at least one of the all-column test signal, the first adjacent column test signal, and the second adjacent column test signal is enabled.

4. The multi-column decoder stress test circuit of claim 2 wherein the control coding unit comprises:
   a first logic unit configured to receive an active pulse, the all-column test signal, the first adjacent column test signal, and the second adjacent column test signal to output control signals; and
   a first coding unit coupled to the first logic unit, the first coding unit configured to receive the control signal and the first column address, and to output the control coding signal.

5. The multi-column decoder stress test circuit of claim 4, wherein the first logic unit comprises:
   an all-column control unit configured to receive the active pulse and to output a first control signal;
   a first adjacent column control unit configured to receive the all-column test signal and the first adjacent column test signal and to output a second control signal; and
   a second adjacent column control unit configured to receive the all-column test signal and the second adjacent column test signal and to output a third control signal.

6. The multi-column decoder stress test circuit of claim 5, wherein the all-column control unit is further configured to output the first control signal having a low level when the active pulse becomes a low level signal.

7. The multi-column decoder stress test circuit of claim 5, wherein the first adjacent column control unit is further configured to output the second control signal having a low level when the all-column test signal or the first adjacent column test signal is enabled.

8. The multi-column decoder stress test circuit of claim 5, wherein the second adjacent column control unit is further configured to output the third control signal having a low level when the all-column test signal or the second adjacent column test signal is enabled.

9. The multi-column decoder stress test circuit of claim 5, wherein the first coding unit comprises:
   an all-column address unit configured to output high-level signals corresponding to a decoding number of the first column address regardless of information about the first column address according to the first control signal; and an adjacent column address unit coupled to the all-column address unit, the adjacent column address unit configured to receive an output of the all-column address unit according to the second control signal and the third control signal, and to output the control coding signal.

10. The multi-column decoder stress test circuit as claimed in 9, wherein the adjacent column address unit comprises:
a first adjacent column address unit configured to output the control coding signal having a low level as the second control signal is enabled; and
a second adjacent column address unit configured to output the control coding signal having a low level as the third control signal is enabled.

11. The multi-column decoder stress test circuit as claimed in 4, wherein the control coding unit is configured to output the control coding signal having a high level, when the all-column test signal is enabled.

12. The multi-column decoder stress test circuit as claimed in 1, wherein the main coding unit comprising:
a first main coding unit configured to receive third column addresses, which are a portion of the second column addresses, according to the multi-column enable signal, and to output a first main coding signal; and
a second main coding unit coupled to the first main coding unit, the second main coding unit configured to receive fourth column addresses among the second column addresses except for the third column addresses according to the multi-column enable signal, and to output a second main coding signal.

13. The multi-column decoder stress test circuit as claimed in 12, wherein the first main coding unit comprises:
a second logic unit configured to receive the third column addresses according to the multi-column enable signal and to output third modified column addresses; and
a second coding unit configured to receive the multi-column enable signal and the third column addresses and to output the first main coding signal which is a portion of the main coding signals.

14. The multi-column decoder stress test circuit as claimed in 13, wherein the second logic unit includes a plurality of second unit logic sections, and wherein each second unit logic section comprises:
a first OR gate configured to perform an operation by receiving one of the third column addresses and the multi-column enable signal;
a first inverter coupled to the first OR gate, the first inverter configured to invert an output of the first OR gate; and
a second OR gate coupled to the first inverter, the second OR gate configured to perform an operation by receiving the multi-column enable signal and an output of the first inverter and to output the third modified column address corresponding to one of the third column addresses.

15. The multi-column decoder stress test circuit as claimed in 13, wherein the second coding unit further comprises a decoder configured to decode the third modified column address and to output the first main coding signal.

16. The multi-column decoder stress test circuit as claimed in 12, wherein the second main coding unit includes:
a third logic unit configured to receive the fourth column addresses according to the multi-column enable signal and to output fourth modified column addresses; and
a third coding unit coupled to the third logic unit, the third coding unit configured to receive the multi-column enable signal and the fourth column addresses and to output the second main coding signal.

17. A multi-column decoder stress test circuit comprising:
a first predecoder configured to receive and decode an all-column test signal, a first adjacent column test signal, a second adjacent column test signal, and a portion of column addresses and to output a multi-column enable signal and a control coding signal;
a second predecoder configured to receive and decode remaining column addresses, excluding the column addresses received in the first predecoder, according to the multi-column enable signal and to output a main coding signal; and
a main decoder configured to receive and decode the control coding signal and the main coding signal and to output a column selection signal.

18. The multi-column decoder stress test circuit of claim 17, wherein the first predecoder further comprises:
a controller configured to output the multi-column enable signal which is enabled when at least one of the all-column test signal, the first adjacent column test signal, and the second adjacent column test signal is enabled; and
a control coding unit coupled to the controller, the control coding unit configured to receive first column addresses, which are a portion of the column addresses, according to the all-column test signal, the first adjacent column test signal, the second adjacent column test signal, and the multi-column enable signal, and to output a plurality of control coding signals.

* * * * *